(12) United States Patent
Nath et al.

(10) Patent No.: US 12,324,248 B2
(45) Date of Patent: Jun. 3, 2025

(54) ELECTROSTATIC DISCHARGE DEVICE WITH PINCH RESISTOR

(71) Applicant: GLOBALFOUNDRIES U.S. Inc., Malta, NY (US)

(72) Inventors: Anindya Nath, Essex Junction, VT (US); Robert J. Gauthier, Jr., Williston, VT (US); Rajendran Krishnasamy, Essex Junction, VT (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 489 days.

(21) Appl. No.: 17/842,266

(22) Filed: Jun. 16, 2022

(65) Prior Publication Data

US 2023/0411384 A1 Dec. 21, 2023

(51) Int. Cl.
*H10D 89/00* (2025.01)
*H10D 1/47* (2025.01)
*H10D 89/60* (2025.01)

(52) U.S. Cl.
CPC ............ *H10D 89/911* (2025.01); *H10D 1/47* (2025.01); *H10D 89/711* (2025.01)

(58) Field of Classification Search
None
See application file for complete search history.

(56) References Cited

U.S. PATENT DOCUMENTS

| 6,566,715 | B1 | 5/2003 | Ker et al. | |
| 7,244,992 | B2* | 7/2007 | Ker | H10D 89/811 257/362 |
| 7,714,356 | B2 | 5/2010 | Abou-Khalil et al. | |
| 2006/0220104 | A1* | 10/2006 | Fujiwara | H10D 10/421 257/E21.375 |
| 2007/0298578 | A1* | 12/2007 | Khater | H10D 10/021 257/E29.193 |
| 2008/0044969 | A1* | 2/2008 | Ker | H10D 89/811 438/362 |
| 2010/0067155 | A1* | 3/2010 | Gallerano | H10D 30/60 361/56 |
| 2021/0217849 | A1* | 7/2021 | Jain | H10D 30/0323 |

OTHER PUBLICATIONS

Application and Drawings for U.S. Appl. No. 17/170,325, filed Feb. 8, 2021, 26 pages.

* cited by examiner

*Primary Examiner* — Bilkis Jahan
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to an electrostatic discharge device (ESD) with a pinch resistor and methods of manufacture. The structure includes: a semiconductor substrate; a shallow trench isolation structure extending into the semiconductor substrate; an amorphous layer in the semiconductor substrate and below the shallow trench isolation structure; and a pinch resistor between the shallow trench isolation structure and the amorphous layer.

20 Claims, 5 Drawing Sheets

ELECTROSTATIC DISCHARGE DEVICE WITH PINCH RESISTOR

BACKGROUND

The present disclosure relates to semiconductor structures and, more particularly, to an electrostatic discharge device (ESD) with a pinch resistor and methods of manufacture.

Electrostatic discharge (ESD) is a sudden and momentary flow of electric current between two electrically charged objects caused by contact, an electrical short or dielectric breakdown. ESD can cause failure of solid state electronics components such as integrated circuits. For example, integrated circuits can suffer permanent damage or failure when subjected to an ESD event.

Electrostatic discharge (ESD) protection devices protect electronic devices in an integrated circuit from excessive voltage or ESD events. A variety of ESD protection devices are known such as diodes (often in the avalanche multiplication regime), metal-oxide-semiconductor (MOS) transistors (typically in the punch-through regime) and bipolar transistors (usually in punch-through mode). The electrical characteristics of diodes, MOS and bipolar transistors are device and manufacturing technology dependent. As such, integrated circuits which employ these ESD protection devices often must be redesigned and recharacterized for each successive technology generation thus requiring complex and costly manufacturing processes. Moreover, existing ESD solutions show non-uniform triggering in a multi-finger device which causes high turn on resistance, weak ESD protection robustness and inefficient use of chip area.

SUMMARY

In an aspect of the disclosure, a structure comprises: a semiconductor substrate; a shallow trench isolation structure extending into the semiconductor substrate; an amorphous layer in the semiconductor substrate and below the shallow trench isolation structure; and a pinch resistor between the shallow trench isolation structure and the amorphous layer.

In an aspect of the disclosure, a structure comprises: a lateral NPN device within a semiconductor substrate; a shallow trench isolation structure extending into the semiconductor substrate and which provides the lateral NPN device a modulating resistance path to a base contact; an amorphous layer in the semiconductor substrate and below the shallow trench isolation structure; and a pinch resistor contacting the shallow trench isolation structure and the amorphous layer.

In an aspect of the disclosure, a method comprising: forming a shallow trench isolation structure extending into a semiconductor substrate; forming an amorphous layer in the semiconductor substrate and below the shallow trench isolation structure; and forming a pinch resistor between the shallow trench isolation structure and the amorphous layer.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to an electrostatic discharge (ESD) device with a pinch resistor and methods of manufacture. More specifically, the present disclosure relates to a lateral bipolar transistor (or NPN structure) with an electrostatic discharge device with a pinch resistor. In embodiments, the pinch-resistor is sandwiched between a shallow trench isolation structure and a high resistance substrate layer, e.g., amorphous silicon. Advantageously, the present disclosure provides efficient usage of area, lower $R_{on}$ due to an increased effective semiconductor (Si) volume and uniform triggering (e.g., uniform current distribution with a smaller trigger voltage) in a lateral NPN structure using the pinch resistor. Moreover, the present disclosure provides a controllable trigger voltage.

The electrostatic discharge device with pinch resistor of the present disclosure can be manufactured in a number of ways using a number of different tools. In general, though, the methodologies and tools are used to form structures with dimensions in the micrometer and nanometer scale. The methodologies, i.e., technologies, employed to manufacture the electrostatic discharge device with pinch resistor of the present disclosure have been adopted from integrated circuit (IC) technology. For example, the structures are built on wafers and are realized in films of material patterned by photolithographic processes on the top of a wafer. In particular, the fabrication of the electrostatic discharge device with pinch resistor uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
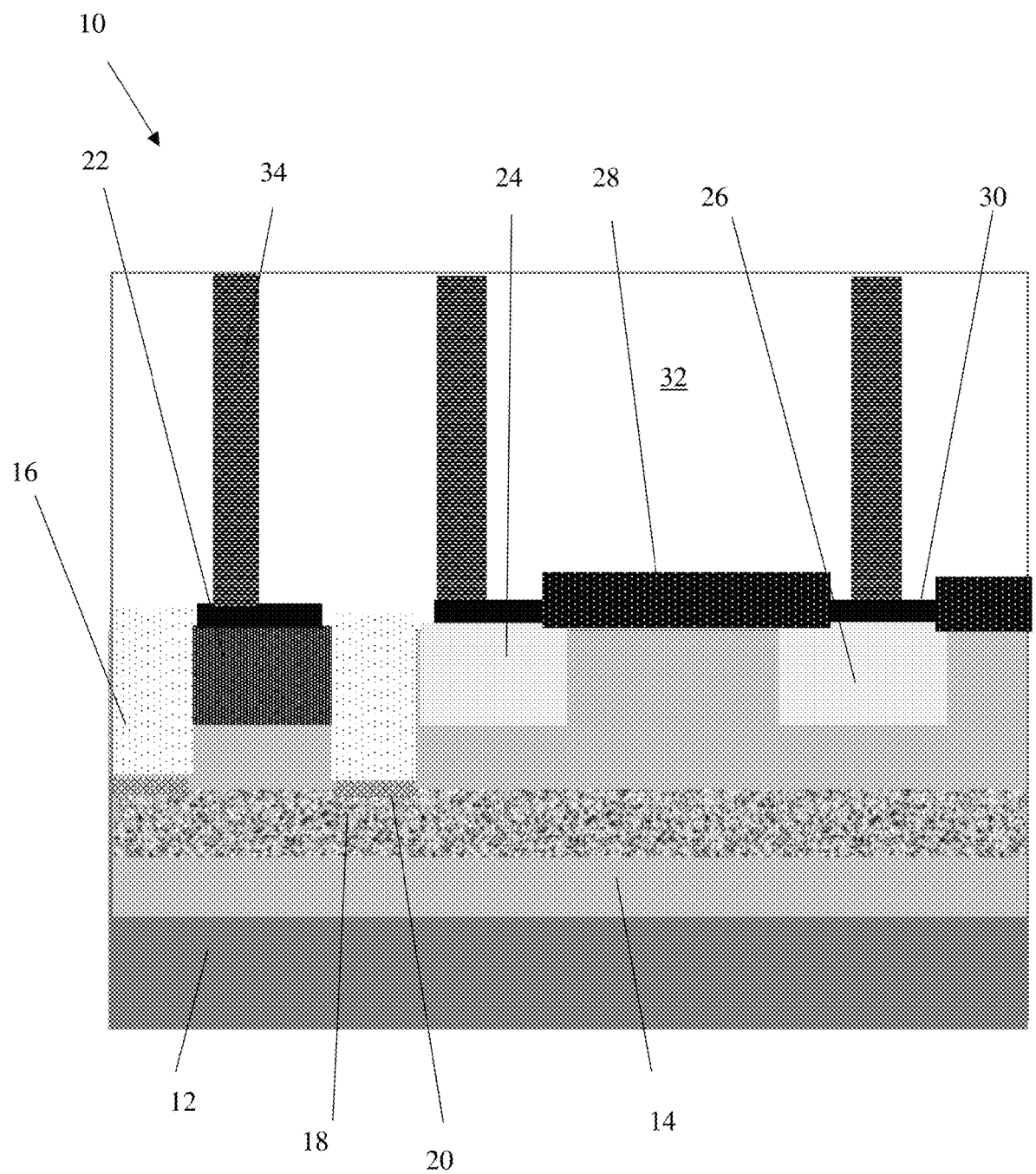
FIG. 1 shows an electrostatic discharge (ESD) device with a pinch resistor in accordance with aspects of the present disclosure.

FIG. 1 shows an electrostatic discharge device with pinch resistor in accordance with aspects of the present disclosure. More specifically, the structure 10 shown in FIG. 1 includes a lateral NPN structure with an electrostatic discharge device with pinch resistor. In embodiments, the structure 10 includes a semiconductor substrate 12 which may include any appropriate semiconductor material such as, for example, Si, Ge, SiGe, SiC, SiGeC, a III-V compound semiconductor, II-VI compound semiconductor or any combinations thereof. The semiconductor substrate 12 may also comprise any suitable crystallographic orientation (e.g., a (100), (110), (111), or (001) crystallographic orientation). The semiconductor substrate 12 includes a P-type well 14.

Still referring to FIG. 1, shallow trench isolation structures 16 may be provided in the semiconductor substrate 12. The shallow trench isolation structures 16 effectively isolate a base contact from different regions of an NPN structure, e.g., P+ base from N+ collector and N+ emitter within the P-type well 14. As described with respect to FIG. 4A, the shallow trench isolation structures 16 may be fabricated using conventional lithography, etching and deposition methods.

An amorphous layer 18 may be provided in the P-type well 14, below the shallow trench isolation structures 16. In embodiments, the amorphous layer 18 may be a high resistivity layer provided within the semiconductor substrate 12 and, more particularly, within the P-type well 14 of the semiconductor substrate 12. The amorphous layer 18 may be formed using an argon or other inert gas implant as described with respect to FIG. 4B.

A polycrystalline material 20 may be in a gap between the amorphous layer 18 and the shallow trench isolation structures 16. In embodiments, the polycrystalline material 20 is a polycrystalline semiconductor material (e.g., Si material) that may directly contact both the amorphous layer 18 and the shallow trench isolation structures 16. In this way, the polycrystalline material 20 may act as a pinch resistor between the amorphous layer 18 (e.g., high resistivity layer) and the shallow trench isolation structures 16. In embodiments, the gap may be, e.g., 100 nm to 150 nm; although other dimensions are contemplated by the present disclosure depending on technology node and performance requirements.

FIG. 1 further shows a base 22, collector 24 and emitter 26 within the semiconductor substrate 12. In embodiments, the base 22 comprises a P+ implant; whereas the collector 24 and emitter 26 comprise an N+ implant. In this way, each of the base 22, collector 24 and emitter 26 are laterally positioned in a horizontal plane forming a lateral bipolar transistor within the P-type well 14 with the shallow trench isolation structure 16 isolating the base 22 from the remaining portion of the structure (the collector 24 and emitter 26). As should be understood, the collector 24 and emitter 26 within the P-type well 14 form, e.g., lateral NPN structure. In embodiments, the amorphous layer 18 may also provide isolation for the NPN device. In addition, the shallow trench isolation structure 16 may be a guard ring around the P-type well 14.

The base 22 and collector 24 abut and directly contact the shallow trench isolation structures 16. In embodiments, the shallow trench isolation structures 16 provides electrical isolation between the base 22 and collector 24 and emitter 26. And as should be recognized by those of skill in the art, the pinch resistor 20 helps to obtain a smaller trigger voltage and uniform triggering (e.g., of multi-finger devices, which in turn yields lower Ron, as all the parallel fingers are turned on). Also, once the NPN structure is turned on, the current does not flow through the pinch resistor anymore and flows between the collector 24 and emitter 26. Accordingly, the combination of the pinch resistor 20 contacting the amorphous layer 18, it is possible to lower $R_{on}$, and provide uniform triggering (e.g., uniform current distribution and smaller trigger voltage). It is also possible to control the trigger voltage by changing the dimensions of the shallow trench isolation structures 16 as this would also change the dimensions of the pinch resistor 20. For example, a wider or deeper shallow trench isolation structure 16 may increase the resistance of the device. The amorphous layer 18 and the pinch resistor 20 can also be used to increase the body resistance.

FIG. 1 further shows a blocking material 28 on the semiconductor substrate 12 between the implant regions, e.g., between the collector 24 and emitter 26. The blocking material 28 may be any insulator material, e.g., nitride, which prevents silicide contacts 30 from forming on the semiconductor substrate 12 between the collector 24 and emitter 26. Accordingly, by utilizing the blocking material 28, it is possible to form silicide contacts 30 on the implant regions, e.g., base 22, collector 24 and emitter 26, without forming silicide contacts on unwanted regions of the semiconductor substrate 12. As described in more detail with respect to FIG. 4D, the silicide contacts 30 may be formed using conventional silicide processes. A plurality of contacts 34 within dielectric material 32 may contact the base 22, collector 24 and emitter 26 and, more specifically, the plurality of contacts 34 contact the silicide contacts 30 over the base 22, collector 24 and emitter 26.

Figure 2:
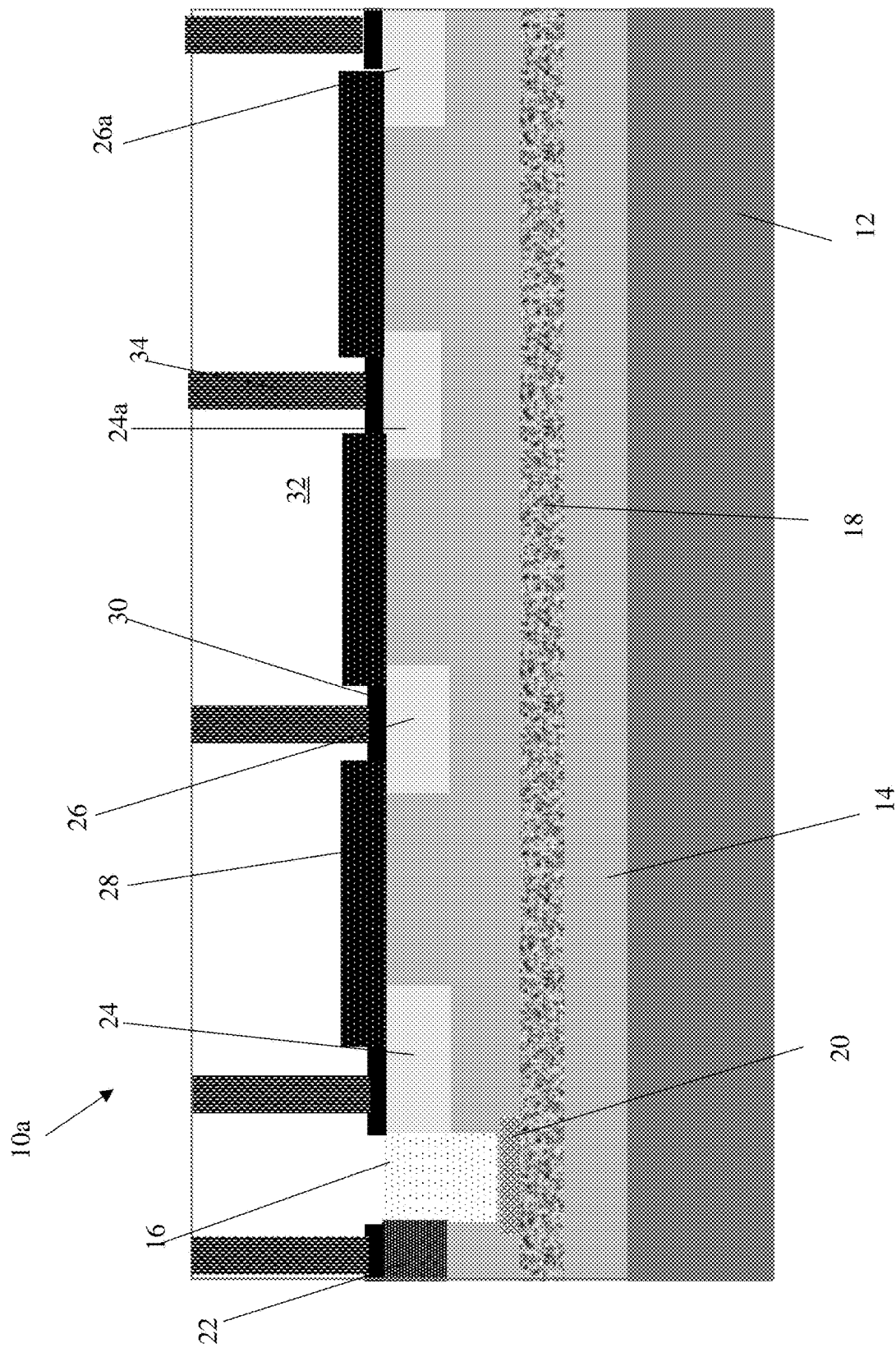
FIG. 2 shows a multi-fingered electrostatic discharge device with a pinch resistor in accordance with additional aspects of the present disclosure.

FIG. 2 shows a multi-fingered electrostatic discharge device with a pinch resistor in accordance with additional aspects of the present disclosure. In this structure 10a, multiple collectors 24, 24a and emitters 26, 26a are provided within the P-type well 14. Similar to the embodiment shown in FIG. 1, the base 22 and collectors 24, 24a abut and directly contact the shallow trench isolation structures 16, with a pinch resistor 20 between the shallow trench isolation structures 16 and the amorphous layer 18. In addition, the blocking material 28 is provided between each of the multiple collectors 24, 24a and emitters 26, 26a to protect the semiconductor material 12 from silicide contact formation.

As in FIG. 1, the silicide contact 30 and respective contacts 34 contact (electrically and directly) the respective base 22, multiple collectors 24, 24a and emitters 26, 26a. It should also be understood that although two collectors 24, 24a and emitters 26, 26a are shown, the present disclosure contemplates any number of multiple collectors 24, 24a and emitters 26, 26a depending on the desired design criteria. The remaining features are the same as provided in FIG. 1.

Figure 3:
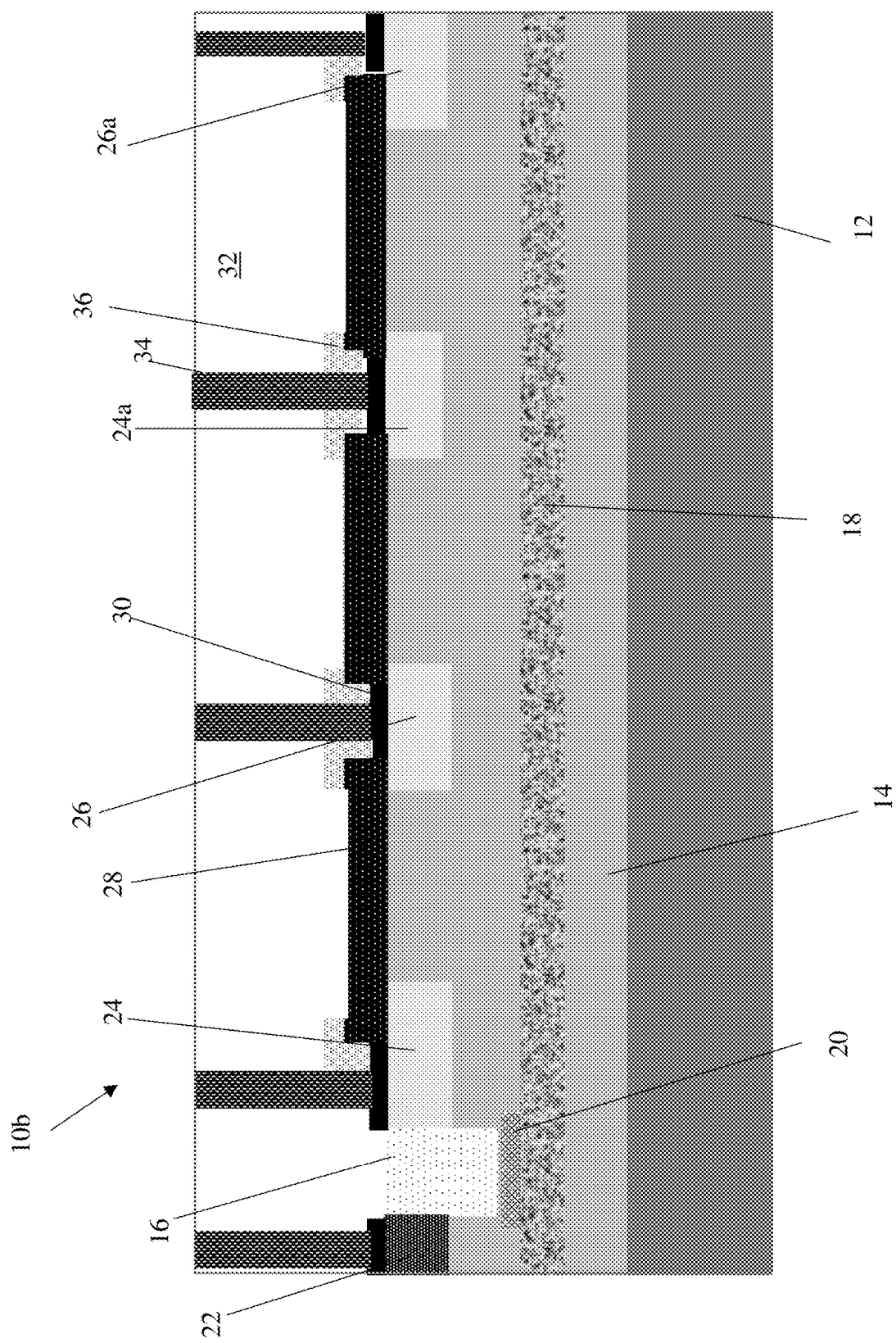
FIG. 3 shows a multi-fingered electrostatic discharge device with a pinch resistor in accordance with further aspects of the present disclosure.

FIG. 3 shows a multi-fingered electrostatic discharge device with a pinch resistor in accordance with further aspects of the present disclosure. In the structure 10b, multiple collectors 24, 24a and emitters 26, 26a are provided within the P-type well 14. Similar to the embodiment shown in FIG. 2, the base 22 and collectors 24, 24a abut and directly contact the shallow trench isolation structures 16, with the pinch resistor 20 between the shallow trench isolation structures 16 and the amorphous layer 18. In the structure 10b, though, spacers 36 are provided adjacent to the silicide contacts 30 of each of the multiple collectors 24, 24a and emitters 26, 26a. The spacers 36 may be polysilicon material which improves isolation and reduces leakage from the multiple collectors 24, 24a and emitters 26, 26a. The spacers 36 may be deposited and patterned prior to silicide formation. In further embodiments, the blocking material 28 can be completely removed when using the polysilicon spacers 36. The remaining features are the same as provided in FIG. 2.

Figure 4A:
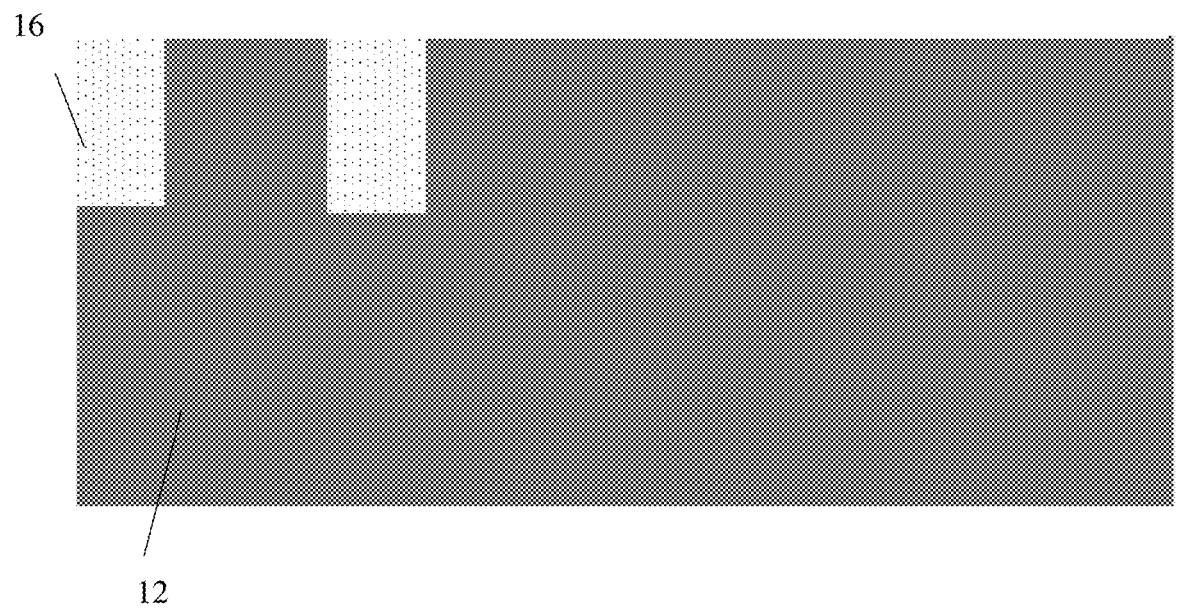
FIGS. 4A-4D show processing steps for fabricating the electrostatic discharge device with a pinch resistor of FIG. 1 in accordance with aspects of the present disclosure.

FIGS. 4A-4D show processing steps for fabricating the structure 10 of FIG. 1. In FIG. 4A, shallow trench isolation structures 16 may be formed in the semiconductor substrate 12. The shallow trench isolation structures 16 can be formed by conventional lithography, etching and deposition methods known to those of skill in the art. For example, a resist formed over the semiconductor substrate 12 is exposed to energy (light) and developed to form a pattern (opening). An etching process with a selective chemistry, e.g., reactive ion etching (RIE), will be used to transfer the pattern from the patterned resist layer to the semiconductor substrate 12 to form one or more trenches in the intrinsic base material 16 and the semiconductor layer 12c. Following the resist removal by a conventional oxygen ashing process or other known stripants, insulator material (e.g., $SiO_2$) can be deposited by any conventional deposition processes, e.g., chemical vapor deposition (CVD) processes. Any residual material on the surface of the intrinsic base material 16 can be removed by conventional chemical mechanical polishing (CMP) processes.

Figure 4B:
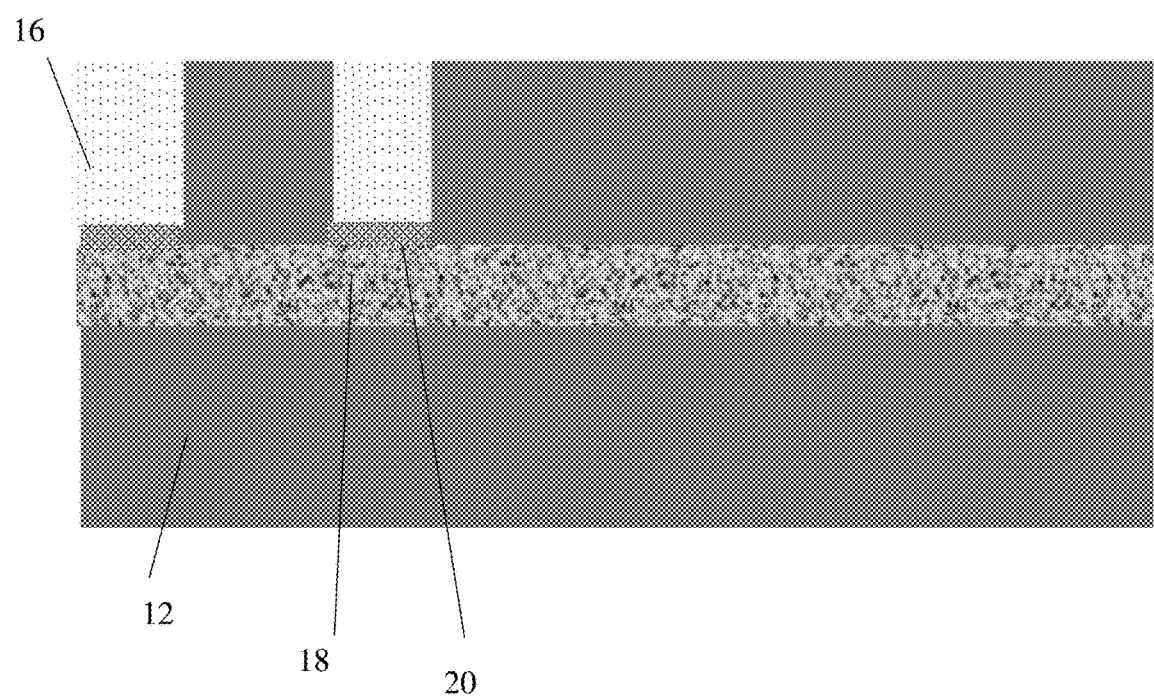

Referring now to FIG. 4B, the amorphous layer 18 is formed in the semiconductor substate 12, below the shallow trench isolation structures 16. In embodiments, the amorphous layer 18 may be a trap-rich region composed of defective semiconductor material. In more specific embodiments, the amorphous layer 18 may be an amorphous semiconductor material such as polysilicon, Si or other semiconductor material comprising defects. In one exemplary embodiment, the defects may be provided by an implant process using an inert gas, e.g., an argon implant, followed by a thermal anneal. For example, the defects may be provided by an implant process using an inert gas, e.g., an argon implant process at a low dose and energy followed by an anneal process. The argon implant can be at a dose of 30 Kev to 500 Kev (compared to a standard implantation dosage of about 900 Kev), and the energy can be at 1e14 to 1e15 (compared to a standard energy of 1e16). Other implants may be, e.g., xenon (Xe), arsenic (As), or germanium (Ge) as is known in the art such that no further explanation is required for a complete understanding of the present disclosure. In embodiments, the implant process will also form the polycrystalline 20 (e.g., pinch resistor) between the amorphous layer 18 and the shallow trench isolation structures 16.

Figure 4C:
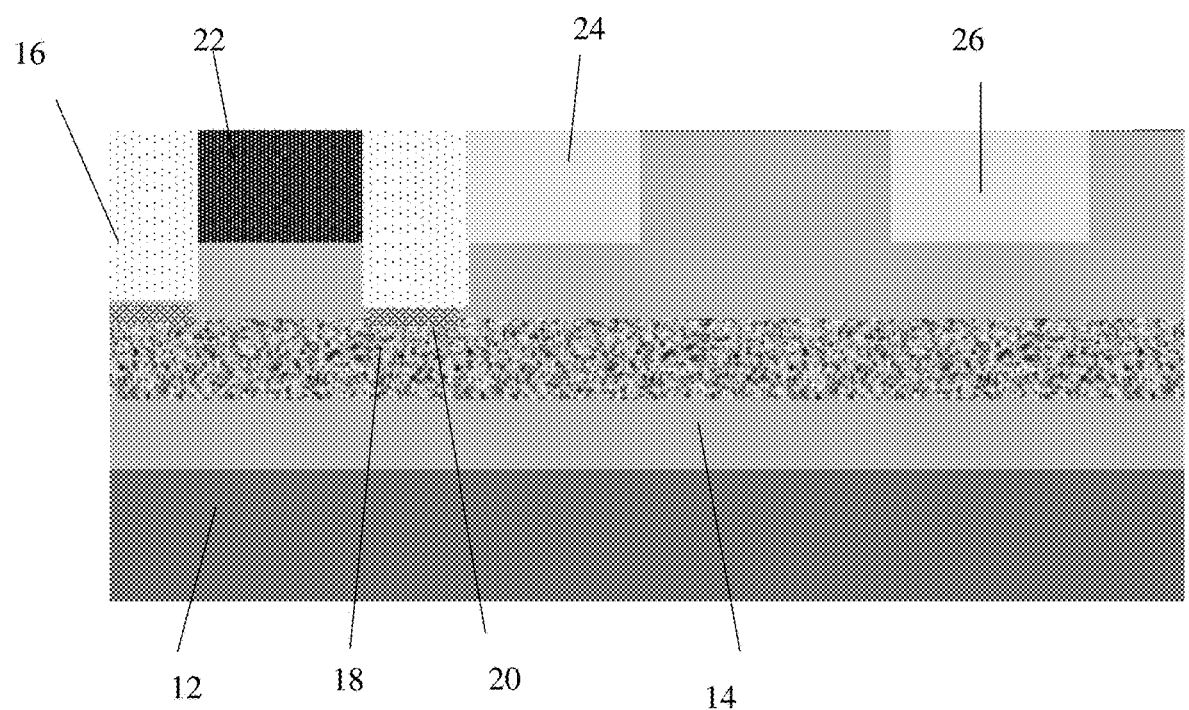

In FIG. 4C, the P-type well 14 and the P and N implant regions (e.g., base 22, collector 24 and emitter 26) may be formed in the semiconductor substrate 12 using an ion implant process. For example, the P-type well 14 and the P and N implant regions may be formed by introducing different dopants by, for example, ion implantation in the semiconductor substrate 12. In embodiments, respective patterned implantation masks may be used to define selected areas exposed for the implantations. The implantation mask used to select the exposed area for forming the P-type well 14 is stripped after implantation, and before the implantation masks used to define the P and N implant regions. Similarly, the implantation mask used to select the exposed area for forming the P implant region, e.g., base 22, (or N region) is stripped after the implantation is performed, and prior to the implantation mask used to define the N implant regions, e.g., collector 24 and emitter 26 (or P region). The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions. The P-type well 14 and base 22 may be doped with p-type dopants, e.g., Boron (B), and the N+ regions (e.g., collector 24 and emitter 26) well is doped with n-type dopants, e.g., Arsenic (As), Phosphorus (P) and Sb, among other suitable examples. A rapid thermal annealing process may be performed to drive in the dopants.

Figure 4D:
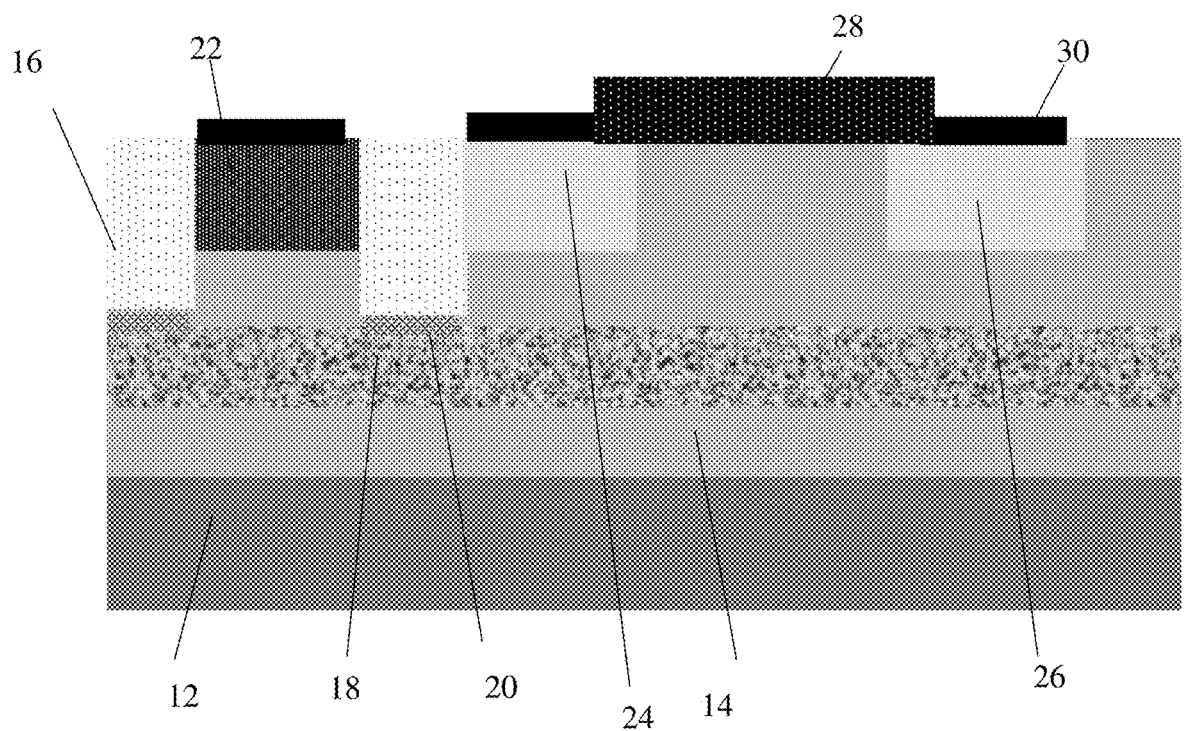

As further shown in FIG. 4D, a blocking material 28 may deposited and patterned over the semiconductor substrate 12 to expose the base 22, collector 24 and emitter 26. The blocking material 28 may be a nitride material deposited by a conventional CVD process, followed by a conventional lithography and etching process as described herein.

A silicide contact 30 is formed on the exposed regions of the base 22, collector 24 and emitter 26. As should be understood by those of skill in the art, the silicide process begins with deposition of a thin transition metal layer, e.g., nickel, cobalt or titanium, over the base 22, collector 24 and emitter 26. After deposition of the material, the structure is heated allowing the transition metal to react with exposed silicon (or other semiconductor material as described herein) in the active regions of the semiconductor device (e.g., the base 22, collector 24 and emitter 26.) forming a low-resistance transition metal silicide. Following the reaction, any remaining transition metal is removed by chemical etching, leaving silicide contacts 30.

Referring back to FIG. 1, an interlevel dielectric material 32 may be deposited over the base 22, collector 24 and emitter 26. The interlevel dielectric material 32 may be a layered structure of oxide and nitride material. The interlevel dielectric material 32 may be deposited by a conventional deposition method, e.g., CVD. The interlevel dielectric material 32 undergoes a patterning process, e.g., lithography and etching, to form vias or trenches to the base 22, collector 24 and emitter 26. A conductive material, e.g., tungsten, is deposited within the vias or trenches, making contact to the silicide 30 of the base 22, collector 24 and emitter 26. Any residual conductive material may be removed from the interlevel dielectric material 32 by a conventional CMP process. It should be understood by those of ordinary skill in the art that the vias or trenches can be lined with a barrier metal, e.g., TaN, TiN, etc., prior to the deposition of the tungsten material.

The electrostatic discharge device with pinch resistor can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a semiconductor substrate;
   a shallow trench isolation structure extending into the semiconductor substrate;
   an amorphous layer in the semiconductor substrate and below the shallow trench isolation structure; and
   a pinch resistor between the shallow trench isolation structure and the amorphous layer.

2. The structure of claim 1, wherein the pinch resistor comprises polysilicon material.

3. The structure of claim 1, wherein the pinch resistor contacts the amorphous layer and the shallow trench isolation structure.

4. The structure of claim 3, wherein the amorphous layer comprises a defective semiconductor layer.

5. The structure of claim 3, wherein the amorphous layer comprises a high resistance layer of semiconductor material.

6. The structure of claim 1, further comprising a lateral NPN device in a P-type well of the semiconductor substrate.

7. The structure of claim 6, wherein the lateral NPN device comprises an electro-static discharge specific multi-finger NPN device with the P-type well.

8. The structure of claim 7, wherein the amorphous layer and the pinch resistor are below the lateral NPN device.

9. The structure of claim 6, further comprising a blocking material on the semiconductor substrate between at least a collector and an emitter.

10. The structure of claim 9, wherein the shallow trench isolation structure isolates the base from the collector.

11. The structure of claim 6, further comprising polysilicon spacers between at least a collector and an emitter.

12. The structure of claim 11, wherein the spacers are provided on blocking material between the collector and the emitter.

13. A structure comprising:
    a lateral NPN device within a semiconductor substrate;
    a shallow trench isolation structure extending into the semiconductor substrate and which provides the lateral NPN device a modulating resistance path to a base contact;
    an amorphous layer in the semiconductor substrate and below the shallow trench isolation structure; and
    a pinch resistor contacting the shallow trench isolation structure and the amorphous layer.

14. The structure of claim 13, wherein the amorphous layer comprises defective semiconductor substrate.

15. The structure of claim 13, wherein the pinch resistor comprises polysilicon material directly contacting the shallow trench isolation structure and the amorphous layer.

16. The structure of claim 13, wherein the lateral NPN device comprises an electro-static discharge specific multi-finger NPN device within a P-type well of the semiconductor substrate.

17. The structure of claim 13, further comprising a blocking material on the semiconductor substrate between N+ structures of the NPN device.

18. The structure of claim 17, further comprising polysilicon sidewall spacers separating the blocking material from silicide contacts of the N+ structures of the NPN device.

19. The structure of claim 13, further comprising polysilicon spacers on the semiconductor substrate between N+ structures of the NPN device.

20. A method comprising:
    forming a shallow trench isolation structure extending into a semiconductor substrate;
    forming an amorphous layer in the semiconductor substrate and below the shallow trench isolation structure; and
    forming a pinch resistor between the shallow trench isolation structure and the amorphous layer.

* * * * *